United States Patent [19]
Yui

[11] Patent Number: 4,713,675
[45] Date of Patent: Dec. 15, 1987

[54] EXPOSURE APPARATUS

[75] Inventor: Yoshikiyo Yui, Kawasaki, Japan

[73] Assignee: Canon Kabushiki Kaisha, Tokyo, Japan

[21] Appl. No.: 924,435

[22] Filed: Oct. 29, 1986

[30] Foreign Application Priority Data

Oct. 31, 1985 [JP] Japan .............................. 60-242943
Nov. 27, 1985 [JP] Japan .............................. 60-265110

[51] Int. Cl.⁴ ............................................. G03B 27/72
[52] U.S. Cl. ....................................................... 355/69
[58] Field of Search ................................... 355/67–69; 315/307, 151, 149

[56] References Cited

U.S. PATENT DOCUMENTS

| 4,117,375 | 9/1978 | Bachur et al. | 315/151 |
| 4,246,517 | 1/1981 | Dakroub | 315/307 |
| 4,512,657 | 4/1985 | Sakato | 355/68 |
| 4,527,093 | 7/1985 | Yamauchi et al. | 355/69 X |
| 4,536,681 | 8/1985 | Maki | 315/309 |
| 4,605,301 | 8/1986 | Kira | 355/69 |

FOREIGN PATENT DOCUMENTS 71132 5/1982 Japan .

Primary Examiner—Richard A. Wintercorn
Attorney, Agent, or Firm—Fitzpatrick, Cella, Harper & Scinto

[57] ABSTRACT

An exposure apparatus for exposing a semiconductor wafer to a pattern of the mask with light from a light source, thereby to transfer the pattern of the mask onto the wafer. The appartus includes a shutter operable for selectively passing/blocking the light from the light source to the wafer, and a control system for controlling the intensity of light emission from the light source in a manner that the intensity becomes greater at the time of exposure operation than that at the time of nonexposure operation. The shutter opening movement for effecting the exposure is initiated after the intensity of light from the light source, when it is increased by the control system, becomes substantially stable. This avoids unpreferable effects, upon exposure, of overshooting, ringing, etc. in the light from the light source, such that the amount of exposure of the wafer can be controlled accurately.

9 Claims, 5 Drawing Figures

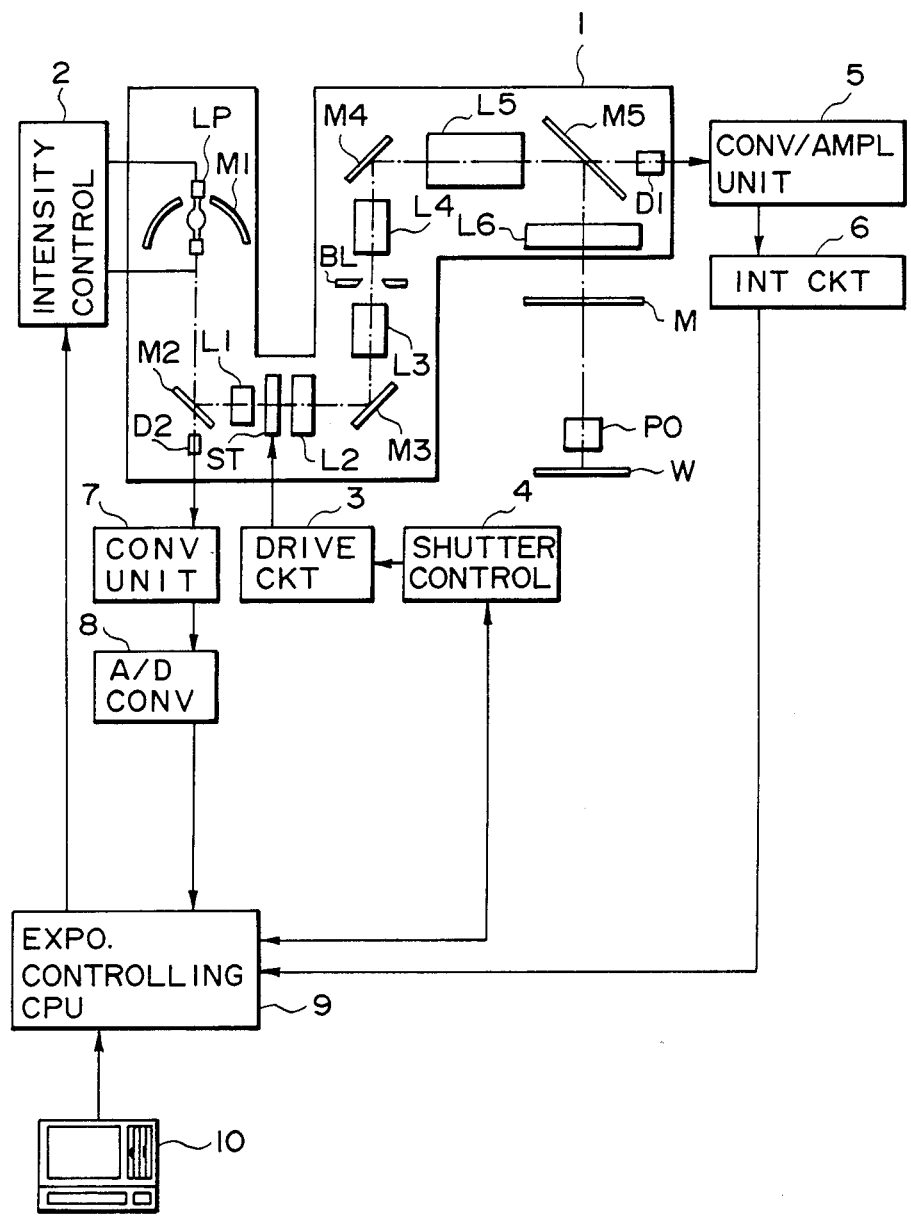
F I G. 3

EXPOSURE APPARATUS

FIELD OF THE INVENTION AND RELATED ART

This invention relates to an exposure apparatus for use in a lithographic process for the manufacture of fine patterns. More particularly, the invention is concerned with an exposure apparatus for transferring a pattern of a mask onto a wafer by use of light from a light source.

In the field of manufacture of semiconductor devices such as integrated circuits, various types of exposure apparatuses are used in the photolithographic pattern transfer processes. These exposure apparatuses use a radiation energy source such as, typically, a light source. For the purpose of saving consumption of an electric power and reduction of heat generation, it is desirable to adjust the intensity of light emission from the light source so as to change the illuminance on a plane in which a workpiece such as a wafer is placed. For example, in a step-and-repeat type projection exposure apparatus usable for transferring images of a pattern of a mask onto different portions of a wafer, the wafer is moved stepwise relative to a projection optical system so that the different portions of the wafer are exposed to the mask pattern in sequence. In respect to saving of power consumption and reduction of heat generation, it is preferable to decrease the intensity of light emission from the light source at the time of stepwise movement of the wafer, i.e. during non-exposure operations. In other words, the intensity of light emission is increased during the exposure operation.

In the photolithographic process using an exposure apparatus, the amount of exposure of the workpiece such as a wafer should be controlled. An example of exposure controlling method is disclosed in Japanese Laid-Open Patent Application, Laid-Open No. 71132/1982. According to this proposal, shutter means is used to control the amount of exposure of a workpiece to light from a light source. A particular consideration has been made in this patent application to the fact that the quantity of light emitted from the source and passing the shutter means during a time period of movement of a shutter blade from its fully closed position to its fully open position is substantially equal to the quantity of light emitting from the source and passing the shutter means during a time period of movement of the shutter blade from its fully open position to its fully closed position. On the basis of such consideration, the operation of the shutter means is controlled so that the quantity of light passing the shutter means during "one exposure", i.e. during a time period from the initiation of shutter opening to the completion of shutter closing, exactly corresponds to an amount of exposure which is preparatorily designated with reference to the workpiece.

SUMMARY OF THE INVENTION

When the intensity of light from a light source is changed, the intensity does not immediately rise or fall. Also, there occur fluctuations such as "overshooting", "undershooting", "ringing", etc. When the intensity of light emission from the source increases, such as shown in FIG. 5, the intensity starts to increase in response to an increase-instructing signal and gradually increases with a certain inclination. After the intensity reaches a desired level, there will occur "overshooting" such as included in a region A and/or "ringing" such as included in a region B. Thus, a certain time period T is necessary until the intensity is stabilized. It leads to that, where the opening movement of the shutter blade when it is in its fully closed position is initiated immediately after the initiation of the intensity increasing operation, the quantity of light passing the shutter means during such shutter opening movement will differ from the quantity of light which will pass the shutter means during the subsequent shutter closing movement. As a result, accurate control of the amount of exposure is not easy.

It is accordingly a primary object of the present invention to provide an exposure apparatus, by which the amount of exposure of a workpiece such as a wafer can be accurately controlled as desired.

Briefly, according to one aspect of the present invention, there is provided an exposure apparatus for exposing an object with light, said apparatus comprising: a light source for emitting light of an intensity; intensity controlling means operative on said light source to change the intensity of light to be emitted from said light source; shutter means operable to selectively pass/block the light from said light source; shutter controlling means operative on said shutter means to control the passage/blockage of the light by said shutter means; integrating means for converting a quantity of light passed through said shutter means into an electric value and for integrating the electric value; exposure setting means for setting an amount of exposure to be achieved on the object; and exposure controlling means for controlling said intensity controlling means and said shutter controlling means on the basis of the amount of exposure set by said setting means, said exposure controlling means being operable to define a delay time before initiation of the exposure of the object and after initiation of the operation of said intensity controlling means upon said light source.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic and diagrammatic view of an exposure apparatus according to another embodiment of the present invention.

DESCRIPTION OF THE PREFERRED EMBODIMENTS

Figure 1:
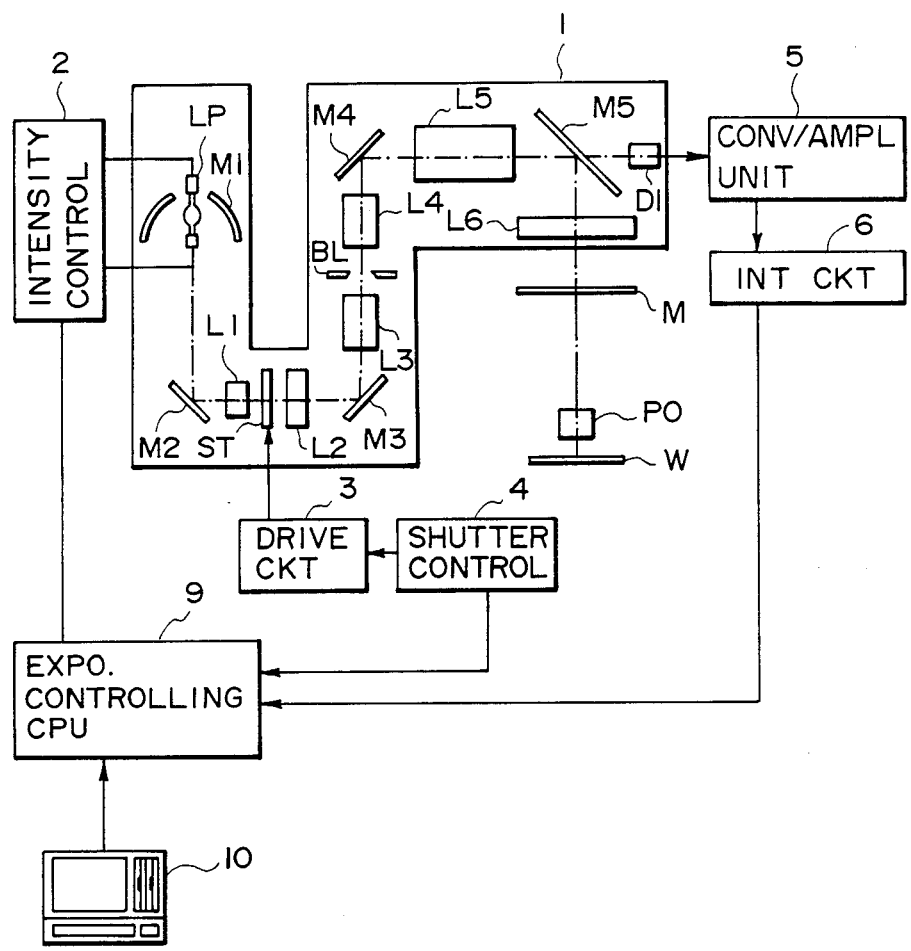
FIG. 1 is a schematic and diagrammatic view of an exposure apparatus according to an embodiment of the present invention.

Referring first to FIG. 1, there is shown an exposure apparatus according to an embodiment of the present invention. As shown in this Figure, the apparatus includes an illumination system 1 for providing light to be used for the exposure of a workpiece W, such as a semiconductor wafer, to a pattern of a mask M. The illumination system 1 includes a light source LP such as a super-high-pressure Hg lamp and an elliptical mirror M1 for effectively concentrating the light from the light source LP. Along the path of light, there are provided a cold mirror M2 effective to reflect ultraviolet rays and transmit almost all infrared rays; optical integrator L1 effective to produce uniform distribution of light; a shutter ST; a lens system L2; a reflecting mirror M3; a lens system L3; a masking blade BL; a lens system L4; a reflecting mirror M4; a lens system L5; a reflecting mirror M5; a photodetector D1 for receiving the light passed through the mirror M5; and a lens system L6. These components are disposed along the optical path in the named order. The mirrors M3, M4 and M5 are provided to bend, at a right angle, the optical axis so as to make the illumination system compact. Also, the reflecting mirror M5 is arranged to transmit a portion of light incident thereon, the transmitted light being directed to the type detector D1 for the sake of detection of the amount of exposure. The lens L3 is provided to converge the light from the light source LP so as to illuminate the masking blade BL uniformly.

The shutter ST of the illumination system 1 is of the type described in U.S. patent application Ser. No. 670,009 filed Nov. 9, 1984 and assigned to the assignee of the subject application. The light emitted from the illumination system 1 illuminates the mask or reticle denoted at M in FIG. 1. The mask M has a circuit pattern prepared for the manufacture of semiconductor devices, in this embodiment. The pattern of the mask M as illuminated is projected onto the wafer W in a reduced scale by a projection optical system PO. That is, the projection optical system PO forms a reduced image of the mask M pattern on the wafer W. In this manner, the wafer W is exposed to the mask M pattern so that the mask M pattern is transferred, in a reduced scale, onto a portion of the wafer W. After the exposure, the wafer is moved stepwise by a driving stage mechanism, not shown, in a plane perpendicular to the optical axis of the projection optical system PO. By repeating exposures and stepwise movement alternately, the mask M pattern is transferred onto different portions of the wafer W.

The apparatus further includes an intensity controlling unit 2 for controlling energization/deenergization of the light source LP and for adjusting the intensity of light to be emitted from the light source LP; a driving circuit 3 for driving the shutter ST; a shutter controlling unit 4 for supplying a controlled voltage to the driving circuit 3 to thereby control the opening/closing operation of the shutter ST; a converting/amplifying unit 5 for converting the output of the detector D1 (which is an electric current) into an electric voltage and for amplifying the electric voltage; an integrating circuit 6 for analog-to-digital converting the output of the converting/amplifying unit 5 and for accumulating or integrating the value obtained by the conversion; an exposure controlling central processing circuit 9 (hereinafter "CPU") for controlling various operations in the exposure apparatus as a whole; and a console unit 10 for allowing input, into the apparatus, various operational parameters such as, e.g. a designated amount of exposure.

Figure 2:
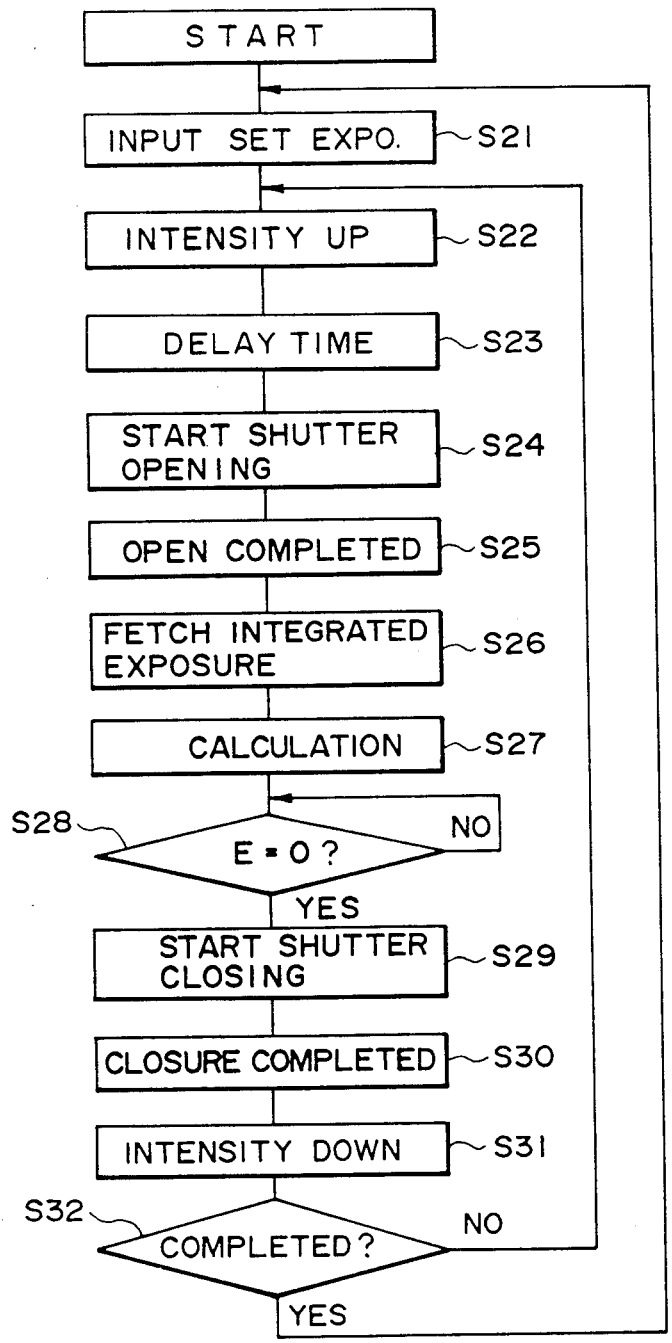
FIG. 2 is a flow chart showing the operation of the exposure apparatus according to the embodiment shown in FIG. 1.

When, in operation, a particular amount of exposure ($I_0$) to be achieved on the wafer W surface is designated at the console unit 10 and the start of the exposure operation is instructed by typing a keyboard of the console 10, the data concerning the thus set exposure as well as a command signal, instructing the start of exposure operation, are inputted into the CPU 9. Then, the exposure process as illustrated in FIG. 2 is initiated under the control of the CPU 9. That is, at step S21, the CPU 9 receives the data concerning the set exposure ($I_0$), and produces at step S22 an instruction signal for increasing the intensity of light emission from the light source LP and supplies it to the intensity controlling unit 2. In response thereto, the intensity controlling unit 2 is operated to increase the intensity of light emission from the light source LP. Subsequently, at step S23, a predetermined delay time corresponding to such time period T that is necessary until the intensity is substantially stabilized at the desired high level after the "overshooting" period, the "ringing" period, etc., is preserved by the CPU 9. That is, the start of exposure is delayed until the intensity from the light source LP becomes stable. If the exposure starts without such delay time at step S23, the "overshooting", "ringing" and the like of the increasing intensity from the light source LP participate in the amount of exposure of the wafer W, resulting in the above-described difficulty in accurate control of the exposure.

After elapse of the delay time, the CPU 9 produces a shutter-opening instructing signal and supplies it to the shutter control unit 4. In response thereto, the shutter controlling unit 4 controls the driving circuit 3 to cause it to start the opening movement of the shutter ST. As the shutter ST opens, a portion of the light emitted from the light source LP and passing the expanding opening or aperture of the shutter ST is incident on the detector D1, whereby it is photoelectrically converted into an electric current which is in turn applied to the converting/amplifying unit 5. The electric current supplied to the unit 5 is converted into an electric voltage and, after being amplified, the electric voltage is outputted from the unit 5 to the integration circuit 6. By this integration circuit 6, the output voltage from the unit 5 is accumulated or integrated. By this integration, data ($I_a$) concerning the amount of exposure with respect to time from start of opening of the shutter ST to the moment of integration is obtained. The thus obtained data ($I_a$) is supplied to the CPU 9.

When, at step S25, the shutter opening movement is completed so that the shutter ST reaches its fully open position, the shutter controlling unit 4 supplies to the CPU 9 an information signal representing completion of the shutter opening movement. In response thereto, the CPU 9 fetches from the integration circuit 6 a data ($I_a$) concerning the amount of exposure detected by the integration circuit 6 at that time (step S25). That is, the amount of exposure ($I_a$) corresponds to the amount of exposure ($I_1$) with respect to time during the shutter opening movement from the fully closed position to the fully open position. In this embodiment, the thus detected exposure "$I_1$" is considered as being substantially equal to the amount of exposure which will be obtainable during the future shutter closing movement from the fully open position to the fully closed position. Accordingly, at step S27, the exposure ($I_1$) detected with reference to the shutter opening movement to the fully open position is subtracted from the set exposure ($I_0$) in order to determine the timing of start of shutter closing movement. That is, an amount of exposure ($I_2$) to be provided from completion of the shutter opening movement to initiation of the shutter closing movement is determined. Namely, at step S27, $I_2=I_0-I_1$ is calculated.

At step S28, the CPU 9 fetches from the integration circuit 6 the data concerning the amount of exposure (Ia) with respect to time from the initiation of the shutter opening movement to the moment of the integration, and compares the data (Ia) with the determined exposure ($I_2$). Such fetching and comparison are repeated with lapse of time. That is, a calculation $E=Ia-I_2$ is made repeatedly until E becomes zero. When $E=0$ is achieved, the CPU 9 supplies the shutter controlling unit 4 with an instruction signal instructing start of shutter closing movement. In response thereto, the shutter controlling unit 4 operates to cause the driving circuit 3 to start closing movement of the shutter ST from its fully open position. When the closing movement of the shutter ST is completed so that the shutter ST is brought into its fully closed position, the shutter controlling unit 4 supplies the CPU 9 with an information signal representing the completion of shutter closure (step S30). Then, the CPU 9 produces an instruction signal, for decreasing the intensity of light emission, and supplies it to the intensity controlling unit 2. In response thereto, the intensity controlling unit 2 operates to decrease the intensity of light to be emitted from the light source LP (step S31). Then, at step S32, discrimination is made as to whether exposures of all the portions of the wafer W are completed. If not completed, the wafer W is moved stepwise by a predetermined amount and the sequence goes back to step S22. If completed, on the other hand, the system goes back to step S21, waiting for input of data concerning a set exposure.

In the present embodiment, the exposure ($I_1$) during the shutter opening movement is subtracted from the set exposure ($I_0$). This is, as fully described in the aforementioned Japanese Patent Application, to allow that an instruction signal for instructing start of shutter closing movement is produced on the basis of expectation of the amount of exposure during the shutter closing movement.

According to this embodiment, as described, a predetermined delay time is set when the intensity of light emission from the light source is increased, thereby to retard the start of exposure operation. By doing so, any divergency of the "exposure" during the shutter opening movement from the "actual exposure" during the shutter closing movement due to the "overshooting", "ringing", etc. during the shutter opening movement can be satisfactorily avoided and, as a result of which, the wafer can be exposed with an accurately controlled amount of exposure.

Referring now to FIG. 3, there is shown an exposure apparatus according to another embodiment of the present invention. As shown in FIG. 3, the apparatus includes a detector D2 which is arranged to detect light emitted from a light source LP and passed through a cold mirror M2 thereby to monitor the intensity of light emission from the light source LP. The apparatus further includes a converting unit 7 for converting an output of the detector D2 into an electric voltage, and an analog-to-digital converter 8 (hereinafter "A/D converter") for converting the output voltage of the unit 7 into a digital signal. The remaining portion of the apparatus is of the same structure as of the corresponding portion of the apparatus of the FIG. 1 embodiment. Therefore, description of this portion is omitted here, by assigning the same reference numerals or characters to the corresponding elements.

Figure 4:
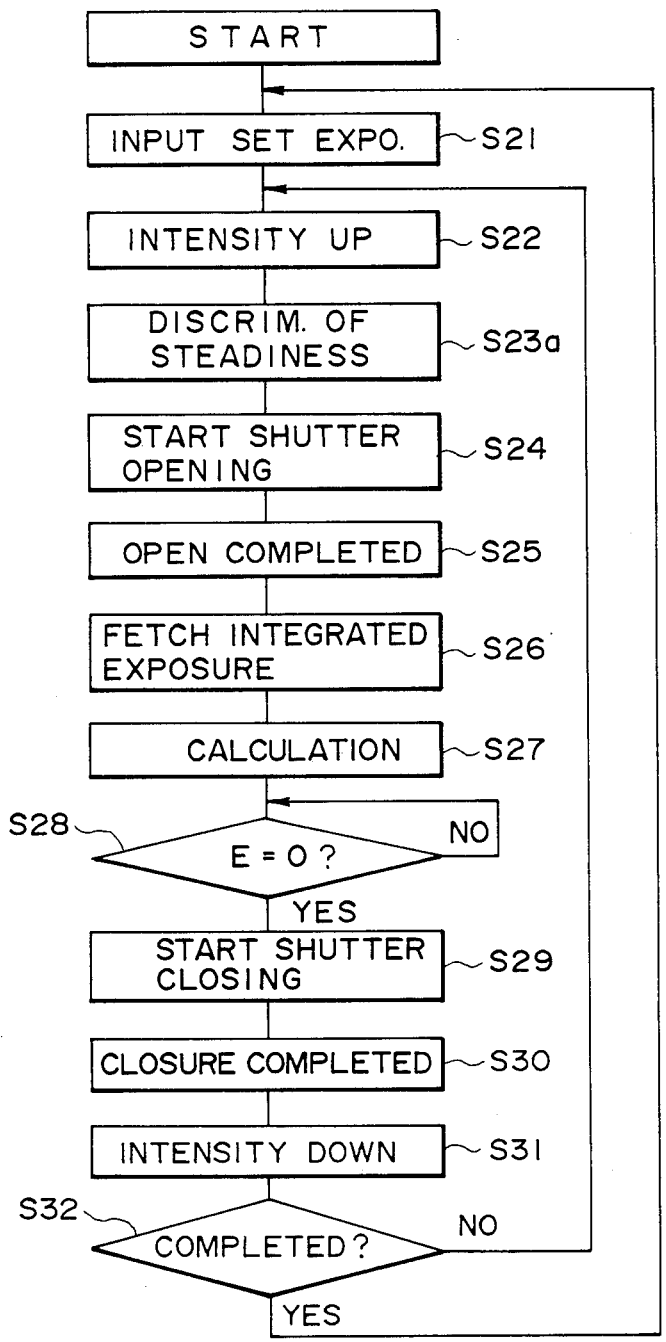
FIG. 4 is a flow chart showing the operation of the exposure apparatus according to the embodiment shown in FIG. 3.
Figure 5:
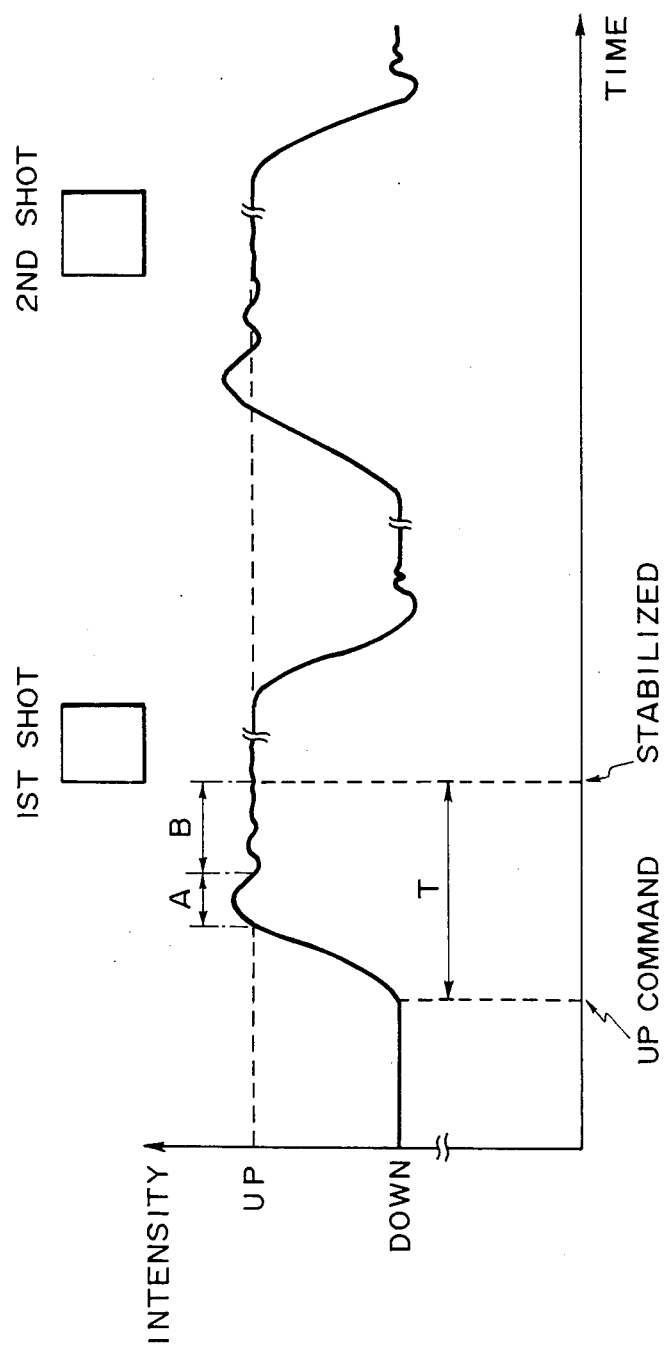
FIG. 5 is a graph showing transitional characteristics at the time of increasing the intensity of light emission from a light source.

When, in operation, data ($I_0$) concerning a particular exposure to be achieved on the wafer W surface is designated at the console 10 and an instruction signal for starting the operation is inputted from the console 10, the data ($I_0$) for the set exposure is supplied to the CPU 9 such that the exposure process as illustrated in FIG. 4 are initiated under the control of the CPU 9. That is, at step S22, the CPU 9 produces an instruction signal for increasing the intensity of light emission from the light source LP, and supplies it to the intensity controlling unit 2. In response thereto, the intensity controlling unit 2 operates to increase the intensity of light emission from the light source LP. As the intensity increases, the output of the detector D2, monitoring the intensity, is being inputted into the converting unit 7. As a result, the unit 7 is applying to the A/D converter 8 an output voltage corresponding to the intensity of the light source LP. The A/D converter 8 is arranged to continuously output, to the CPU 9, the intensity data corresponding to the intensity detected by the detector D2. Thus, at step S23, the CPU 9 fetches the intensity data at a certain sampling timing and, when all the intensity data obtained by the sampling operations of a predetermined number satisfy the predetermined tolerance, it discriminates that the intensity of light emission is stabilized or substantially stabilized at a desired high level. Namely, at this time, it is discriminated that transitional "overshooting", "ringing", etc. of the intensity of light emission at the time of increasing of the same are satisfactorily converged or attenuated. Then, at step S24, the CPU 9 supplies the shutter controlling unit 4 with an instruction signal instructing the start of shutter opening movement. In response thereto, the shutter controlling unit 4 operates to cause the driving circuit 3 to start the opening movement of the shutter ST. As the shutter ST opens, the light emitted from the light source and passing through the expanding aperture or opening of the shutter ST is incident on the mirror M5. A portion of the incident light passes through the mirror 5, while the remaining portion is reflected by the mirror M5 to the mask M. The light passed through the mirror M5 is incident on the detector D1 whereby it is converted into an electric current which, in turn, is inputted into the converting/amplifying unit 5. By this unit 5, the electric current is converted into an electric voltage and, after being amplified, it is applied to the integration circuit 6. The output voltage of the unit 5, after being subjected to the analog-to-digital conversion, is integrated by the integration circuit 6, and as a result of which, an amount of exposure (Ia) with respect to time from the start of shutter opening movement to the moment of the integration is obtained. The data concerning the exposure (Ia) is supplied to the CPU 9.

When the shutter opening movement is completed (step S25), an information signal representing this is supplied to the CPU 9 from the shutter controlling unit 4. Then, as described, the CPU 9 fetches the exposure data (Ia) from the integration circuit 6. The exposure detected at this time is treated as an exposure ($I_1$) achieved during the shutter opening movement. Then, at step S27, the detected exposure ($I_1$) is subtracted from the set exposure ($I_0$), thereby to detect an amount of exposure ($I_2$) for determining the timing of start of shutter closing movement. Namely, the calculation $I_2=I_0-I_1$ is made. As described in the foregoing, the amount of exposure during the shutter closing movement from the fully open position to the fully closed position can be considered as being substantially equal to the amount of exposure (I₁) during the shutter opening movement. Therefore, an accurately controlled exposure (overall exposure) can be attained by starting the shutter closing movement at a moment at which the exposure (Ia) detectable by the integration circuit 6 with respect to time from the start of shutter opening movement becomes equal to the determined exposure ($I_2$).

At step S28, fetching of exposure data (Ia) and comparison of the same with the determined exposure ($I_2$), that is $E = Ia - I_2$, are repeatedly effected until E becomes equal to zero. When $E=0$ is reached, the CPU 9 outputs an instruction signal, instructing start of shutter closing movement, and applies it to the shutter controlling unit 4. In response thereto, the shutter controlling unit 4 operates to cause the driving circuit 3 to start the closing movement of the shutter ST. When the closing movement of the shutter ST is completed (step S30), an information signal representing this is supplied to the CPU 9 from the shutter controlling unit 4. Then, at step S31, the CPU 9 outputs an instruction signal for decreasing the intensity of light emission and applies it to the intensity controlling unit 2. In response thereto, the intensity controlling unit 2 operates to decrease the intensity of light emission from the light source LP. Subsequently, selection is made at step S32 as to whether the system is to be prepared for repeating the exposure process or the system is to be brought into a stand-by state waiting for input of the next operation starting command. If the former is selected, the sequence goes back to step S22. If the latter is selected, the sequence goes back to step S21.

The A/D converter 8 of the present embodiment may be replaced by a differentiator. Substantially the same advantageous effects are attainable by sampling the outputs of the differentiator.

In the present invention, as described, discrimination is made to the steadiness of the intensity of light emission when the intensity is increased to a desired high level. Namely, the shutter opening or the start of exposure is retarded until the intensity of light emission becomes stable, in other words, until the transitional "overshooting", "ringing", etc. at the time of increasing the intensity are satisfactorily attenuated.

While the invention has been described with reference to the structures disclosed herein, it is not confined to the details set forth and this application is intended to cover such modifications or changes as many come within the scope of the following claims.

What is claimed is:

1. An exposure apparatus for exposing an object with light, said apparatus comprising:
    a light source for emitting light of an intensity;
    intensity controlling means operative on said light source to change the intensity of light to be emitted from said light source;
    shutter means operable to selectively pass/block the light from said light source;
    shutter controlling means operative on said shutter means to control the passage/blockage of the light by said shutter means;
    integrating means for converting a quantity of light passed through said shutter means into an electric value and for integrating the electric value;
    exposure setting means for setting an amount of exposure to be achieved on the object; and
    exposure controlling means for controlling said intensity controlling means and said shutter controlling means on the basis of the amount of exposure set by said setting means, said exposure controlling means being operable to define a delay time before initiation of the exposure of the object and after initiation of the operation of said intensity controlling means upon said light source.

2. An exposure apparatus for exposing an object with light, said apparatus comprising:
    a light source for emitting light of an intensity;
    intensity controlling means operative on said light source to change the intensity of light to be emitted from said light source;
    monitoring means for monitoring the intensity of light from said light source;
    discriminating means for discriminating stableness of the intensity of light from said light source;
    shutter means operable to selectively pass/block the light from said light source;
    shutter controlling means operative on said shutter means to control the passage/blockage of the light by said shutter means;
    integrating means for converting a quantity of the light passed through said shutter means into an electric value and for integrating the electric value;
    exposure setting means for setting an amount of exposure to be achieved on the object; and
    exposure controlling means responsive to the discrimination made by said discriminating means in cooperation with said monitoring means, for controlling at least said shutter controlling means on the basis of the amount of exposure set by said setting means thereby to control the exposure of the object.

3. An exposure apparatus for exposing an object with light, said apparatus comprising:
    a light source for emitting light of an intensity;
    shutter means operable for selectively passing/blocking the light from said light source; and
    control means for controlling the exposure of the object so that the operation of said shutter means for allowing passage of the light from said light source is initiated after the intensity of light from said light source is substantially stabilized.

4. An apparatus according to claim 3, wherein said control means is arranged to initiate the operation of said shutter means for allowing passage of the light from said light source in response to elapse of a predetermined time after the intensity of light from said light source is changed.

5. An apparatus according to claim 3, wherein said control means includes means for detecting attenuation of fluctuation in the intensity of light from said light source.

6. An apparatus according to claim 5, wherein said detecting means is adapted to effect sampling operations to the light from said light source at a predetermined time interval and wherein said detecting means detects the attenuation on the basis of information obtained by the sampling operations.

7. A method of exposing an object with light, comprising the steps of:
    producing light of an intensity;
    changing the intensity of light; and
    selectively passing/blocking the light, wherein the passage of the light for irradiating the object is initiated when the intensity of light is substantially stable.

8. An exposure apparatus for exposing a workpiece to a pattern with light, said apparatus comprising:

a light source for emitting light of an intensity with which light the workpiece is to be exposed;

first controlling means operable to increase the intensity of light emission from said light source when the workpiece is to be exposed and for decreasing the intensity of light emission from said light source when the workpiece is not to be exposed; and second controlling means operable to substantially avoid an effect, upon exposure of the workpiece, of a fluctuation in the intensity of the light from said light source, caused at the time of increase of the intensity by said first controlling means, such that the workpiece is exposed with a controlled amount of exposure.

9. An apparatus according to claim 8, wherein said second controlling means is arranged to define a predetermined delay time before the initiation of the exposure of the object and after the initiation of the operation of said first controlling means for increasing the intensity of light from said light source.

* * * * *